United States Patent [19]

Ting et al.

[11] Patent Number: 5,169,680
[45] Date of Patent: Dec. 8, 1992

[54] ELECTROLESS DEPOSITION FOR IC FABRICATION

[75] Inventors: Chiu H. Ting, Saratoga, Calif.; Milan Paunovic, Port Washington, N.Y.

[73] Assignee: Intel Corporation, Santa Clara, Calif.

[21] Appl. No.: 850,251

[22] Filed: Mar. 11, 1992

Related U.S. Application Data

[63] Continuation of Ser. No. 660,547, Feb. 22, 1991, abandoned, which is a continuation of Ser. No. 526,681, May 21, 1990, abandoned, which is a continuation of Ser. No. 318,447, Mar. 2, 1989, abandoned, which is a continuation of Ser. No. 47,667, May 7, 1987, abandoned.

[51] Int. Cl.$^5$ ............................................. C23C 26/00
[52] U.S. Cl. ........................................ 427/96; 427/98; 437/230; 437/228; 437/245; 437/238
[58] Field of Search .................. 427/96, 98; 437/230, 437/245, 228, 238

[56] References Cited

U.S. PATENT DOCUMENTS

| | | | |
|---|---|---|---|
| 3,415,679 | 12/1968 | Chuss | 437/230 |
| 3,666,549 | 5/1972 | Rhodenizer et al. | |
| 4,122,215 | 10/1978 | Vratny | |
| 4,182,781 | 1/1980 | Hooper | 427/98 |
| 4,285,780 | 8/1981 | Schachter | 427/259 |
| 4,343,677 | 8/1982 | Kinsbron et al. | |
| 4,378,384 | 3/1983 | Murakami | 427/98 |
| 4,420,365 | 10/1983 | Lehrer | |
| 4,526,810 | 7/1985 | Nesbitt | |
| 4,543,707 | 10/1985 | Ito et al. | |
| 4,650,698 | 3/1987 | Moriya | 427/250 |

OTHER PUBLICATIONS

Webster's Seventh New Collegiate Dictionary G & C Merriam Company 1963, p. 131.
A. Brenner "Electroless Plating Comes of Ages" Metal Finishing 52, (11), 1954, pp. 68-76; 52(12), 1954, pp. 61-68.
Yusuke Harada et al "The Characterization of Via-Filling Technology with Electroless Plating Method" J. Electrochem. Soc. vol. 133, pp. 2428-2429, 1986.
Fred Pearlstein "Electroless Plating" in Modern Electroplating, ed. by F. A. Lavenheim, J. Wiley & Sons, pp. 710-747, 1974.
S. B. Felch and J. S. Sonico "A Wet Etch for Polysilicon with High Selectivity to Photoresist" Solid State Technology, p. 70, Sep. 1986.

Primary Examiner—Michael Lusignan
Assistant Examiner—Vi Duong Dang
Attorney, Agent, or Firm—Blakely, Sokoloff, Taylor & Zafman

[57] ABSTRACT

Electroless deposition of a conducting material on an underlying conductive region is used in a fabrication of a semiconductor device. Electroless deposition provides a selective and an additive process for forming conductive layers, filling window and providing interconnections and terminals. The conducting material is selectively deposited on a catalytic underlying surface. When the underlying surface is not catalytic, an activation step is used to cause the surface to be catalytic. Where the base underlying surface is a substrate, a contact region is formed on the substrate for electroless deposition of the conducting material.

50 Claims, 2 Drawing Sheets

ELECTROLESS DEPOSITION FOR IC FABRICATION

This is a continuation of application Ser. No. 07/660,547, filed Feb. 22, 1991, abandoned, which is a continuation of application Ser. No. 07/526,681, filed May 21, 1990, abandoned, which is a continuation of application Ser. No. 07/318,447 filed Mar. 2, 1989, abandoned, which is a continuation of application Ser. No. 07/047,667, filed May 7, 1987, abandoned.

BACKGROUND OF THE INVENTION

1. Field of the Invention

The present invention relates to forming conductive patterns on a semiconductor substrate and more specifically to a selective deposition technique connecting various conducting layers during the formation of an integrated circuit.

2. Prior Art

In the manufacture of multiple conductive layer semiconductor devices, such as a double-metal integrated circuit chip, a variety of processes for forming conductive patterns to interconnect various conducting layers of such a device is well-known in the technology. These conductive patterns are commonly formed by a subtractive process, wherein a deposition of a conducting layer over a silicon wafer surface is followed by photolithographic and etching processes for patterning. Evaporation and sputtering techniques are two well-known methods of depositing the conductive layer. The etching process is generally accomplished by wet chemicals or by ionized gas, such as plasma. Normally, a conducting layer is deposited over a silicon wafer with an insulating oxide layer, and then the photolithographical and etching techniques are used to remove the conducting material from unmasked areas such that the desired conducting pattern remains over the underlying layer.

An entirely different approach is to use an additive process wherein the conductive material is deposited selectively only over the area where the conducting layer is to be formed. By selectively adding the conductive material only over the desired area where the conducting layer is to be formed, the etching step can be avoided during such a process.

An example of such an additive process is a lift-off process in which a mask of the conductive pattern is first formed on the underlying material, and then the conductive material is deposited over the entire wafer. The unwanted conducting material is then removed by "lifting-off" by dissolving the photoresist material in a suitable solvent. In this technique, the conducting material is deposited over the mask, whereas with the subtractive process the conductive layer is formed under the photoresistive mask. This additive process requires a deposition step as well as a masking step, but removes the necessity of an etching step. However, because of the necessity of providing a complete conducting layer above the mask for the lift-off technique, it is still not a true additive process.

In the fabrication of high-density integrated circuits, a significant problem is in attempting to obtain planarization of the various layers to obtain a smooth topology. Planarization is necessary to reduce formation of voids, cracks and other well-known undesirable features. However, where interconnections are required between the various conducting layers, openings (vias, holes, windows) are cut into the various insulating layers separating the conducting layers, so that interconnections can be formed between the conducting layers. Because a conductive material needs to fill these various vertical openings, planarization is difficult to achieve and significant problems are encountered in attempting to planarize this layer by utilizing conventional etching methods.

A recent technique has been to utilize a truly additive process of electroless plating to fill these various openings. One such technique is taught in "The Characterization of Via-Filling Technology With Electroless Plating Method", reference 1 cited below, wherein electroless nickel plating using palladium activation is used to fill 2.0 um or larger via holes to achieve substantially planarized upper surface above the via. Although various electrochemical techniques for electroless deposition of metals have been known in the prior art and are described in the prior art references cited below, such use of electroless plating to deposit metals to form substantially planarized semiconductive layers have not been practiced until recently.

The present invention describes a novel metallization process which is both additive and selective to provide conducting layers, as well as an interconnection between layers of a multiple conducting layer semiconductor device for the manufacture of LSI and VLSI circuits.

References:

(1) Yusuke Harada et al., "The Characterization of Via-Filling Technology with Electroless Plating Method", Journal of the Electrochemical Society, Volume 133, pages 2428-2429, November 1986.

(2) M. Paunovic, "Electrochemical Aspects of Electroless Deposition of Metals", Plating, Volume 55, pages 1161-1167, November 1968 (Prior Art).

(3) M. Paunovic, "An Electrochemical Control System for Electoless Copper Bath", Journal of the Electrochemical Society, Volume 127, No. 2, pages 365-369, February 1980 (Prior Art).

(4) L.A. D'Asaro et al., "Electroless Gold Plating on III-V Compound Crystals", Journal of the Electrochemical Society, Volume 127, pages 1935-1940, September 1980 (Prior Art).

(5) Milan Paunovic, "Electrochemical Aspects of Electroless Nickel Deposition", Plating and Surface Finishing, Volume 70, pages 62-66, February 1983 (Prior Art).

(6) U.S. Pat. No. 4,122,215 (Vratny) (Prior Art).

(7) U.S. Pat. No. 4,154,877 (Vratny) (Prior Art).

(8) M. Paunovic, "Activation for Electrochemical Metal Deposition on Nonconductors", Abstract 21, The Electrochemical Society Extended Abstracts, Volume 86-1, page 31, May 1986 (Prior Art).

(9) Milan Paunovic, "Photochemical Selective Activation for Electroless Metal Deposition on Nonconductors", Journal of the Electrochemical Society, Volume 127, pages 441c-447c, September 1980 (Prior Art).

(10) Fred Pearlstein, "Electroless Plating", in Modern Electroplating, Edited by F.A. Lowenheim, John Wiley & Sons, Inc., pages 710-747, 1974 (Prior Art).

(11) S.B. Felch and J.S. Sonico, "A Wet Etch for Polysilicon with High Selectivity to Photoresist", Solid State Technology, page 70, September 1986 (Prior Art).

SUMMARY OF THE INVENTION

The present invention describes a process for selectively depositing a conductive material by using an electroless deposition technique in the fabrication of semiconductor devices. The process of the present invention is on additive process wherein the conductive material is deposited onto an underlying layer and the electroless deposition continues to grow until a predetermined level is reached. This selective deposition technique can be used to pattern substantially planarized conductive layers, interconnections and terminals of a multiple conducting layer integrated circuit device.

The electroless deposition technique of the present invention involves selectively depositing a conducting material on an underlying layer which may be a conductor or nonconductor. If the underlying layer is a catalytic surface for the conducting material then an oxidation-reduction reaction provides for the deposition of the conducting material. If the underlying surface is not catalytic, then an activation of the underlying surface is needed prior to the oxidation-reduction reaction. In an alternative method, a displacement reaction is employed to generate a catalytic surface.

Where the base composition of the underlying layer is a substrate such as silicon, a metal contact region is formed on the substrate surface. The contact region can also be of a silicide or a nitride region. The electroless deposition occurs selectively on this contact region.

DETAILED DESCRIPTION OF THE PRESENT INVENTION

The present invention describes a method for providing selective deposition of conducting materials in the formation of semiconductor devices by using an electroless deposition technique. In the following description, numerous specific details are set forth such as specific temperatures, immersion time, etc., in order to provide a thorough understanding of the present invention. It will be obvious, however, to one skilled in the art that the present invention may be practiced without these specific details. In other instances, well-known processes have not been described in detail in order not to unnecessarily obscure the present invention.

Prior Art

The technique of electroless deposition of various metals is well-known in the prior art and one of the inventors of the present invention has authored a number of articles relating to this subject. Such electroless techniques are described in the various above-listed references. In references 2 and 3, electroless deposition of copper utilizing copper bath or cupric sulfate solution is disclosed. In reference 4, electroless technique for gold plating using potassium borohydride as a reducing agent is described, wherein a substrate is activated in an acidified solution of palladium chloride ($PdCl_2$) prior to plating. Reference 5 teaches the electroless deposition of nickel (Ni) using dimethylamine borane as a reducing agent.

The Vratny references 6 and 7 describe methods for depositing electroless Ni on aluminum (Al) as well as electrolessly depositing of gold (Au). In the Vratny references, the electroless deposition technique is utilized to deposit Ni onto Al to form bonding pads, as well as depositing Au on top of the Ni to provide a Au surface for bonding leads to the semiconductor device. Although an electroless Ni deposition technique is used in the Vratny references, it is used to form bonding pads which are the upper most interconnecting medium of the device to external leads. The Vratny reference 6 and 7 still utilize conventional photolithographic and etching methods to provide the underlying conducting layers. References 8 and 9 discuss prior art for metal deposition on nonconductors.

In reference 1, electroless plating methods are utilized to deposit Ni on Al to fill a via hole which is cut into phosphosilicate glass film; and the Al surface is first activated by Pd for Ni deposition and palladium (Pd) is provided by the lift-off method, and $PdCl_2$ in the wet method.

Present Invention

The present invention describes a novel technique of utilizing selective electroless deposition in the fabrication of double-metal VLSI integrated circuit chips. The electroless deposition technique can be used to form any or a combination of layers of a typical double-metal integrated circuit chip-1 namely first and second conducting layers, interconnection between the first layer and the substrate, interconnection between the two conducting layers and the interconnection pad above the second conducting layer. Although a particular double-metal integrated circuit device is described, a single conducting layer or multiple conducting layers utilizing more than two conducting layers can be constructed. Further, although conducting layers are typically comprised of metal, the present invention can be practiced with other forms of conductors as well. The invention described can be applied to all of the above mentioned steps by a straight forward modifications of this novel process. Also, specific applications will be described in several examples to provide a better understanding of the present invention, however, these examples are not being presented to limit the invention.

Figure 1:
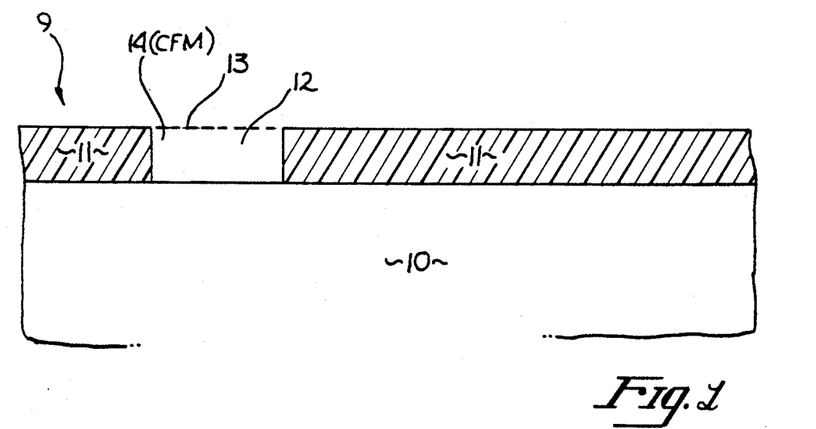
FIG. 1 is a cross-sectional view showing a substrate, an oxide layer and filling of a contact opening by using the selective deposition technique of the present invention.

Referring to FIG. 1, an oxide layer 11 is formed over a silicon substrate 10. It is appreciated that substrate 10 is not limited to silicon but can also be comprised of GaAs, or other III–V semiconductors. The preferred embodiment uses silicon dioxide ($SiO_2$) or doped oxide as oxide layer 11. Then, a contact window 12 is cut into oxide layer 11 to expose a portion of substrate 10 by using a prior art patterning process to pattern layer 11. The formation of oxide layer 11 and the cutting of window 12 require techniques which are well-known in the prior art. Next, a contact filling material 14 is selectively deposited into window 12 by using the additive metallization process of the present invention. The contact filling material 14 for filling contact window 12 is comprised of nickel (Ni), palladium (Pd) or Cobalt (Co), but is not limited to these metals or their alloys.

In the wet metal deposition technique of this invention, when device 9 is immersed in the wet solution, only the contact window 12 is activated for electroless deposition. By utilizing the electroless deposition technique of the present invention, window 12 is filled by the contact filling material 14 until window 12 is filled, as shown by dotted line 13. By carefully monitoring the deposition of contact filling material 14 in window 12 the electroless deposition process can be terminated when contact filling material 14 reaches a predetermined level, as shown by dotted line 13. The surface as shown by dotted line 13 is substantially parallel to the upper surface of oxide 11, such that a substantially planarized surface is formed by oxide layer 11 and contact filling material 14 filling window 13. It is appreciated that the level of the surface shown by line 13 need not necessarily be at the same level as upper surface of oxide 11.

The selective deposition process used to fill contact window 12 occurs in a chemical solution which contains suitable metal ions. The metal ions will selectively deposit only on a suitable surface where the surface contains an electrochemically active material. When Ni is deposited on the silicon surface of substrate 10, the following initial reaction occurs.

$$2Ni^{2+} + Si \rightarrow 2Ni^0 + Si^{4+} \qquad \text{(Equation 1)}$$

Although a silicon surface is a catalytic surface for selective Ni deposition in which no special surface treatment is required, the induction period between the immersion of silicon wafer into a solution and for the active deposition process to occur requires a lengthy time period. The process in Equation 1 is termed displacement deposition and is generally limited in thickness.

The time delay can be reduced by etching the silicon surface just before the deposition cycle by a mixture of HF, $HNO_3$, and $H_2O$. The silicon surface etching produces a rough surface, not only to facilitate the deposition process, but also to enhance the adhesion of the deposited Ni film. Patterned thermal oxide and deposited oxide have been used as a mask for the deposition process. Deposition is selective in that Ni deposits only on silicon and, not over the oxide surface.

To further enhance the deposition process by significantly reducing the time requirement for filling window 12 with filling material 14, an electroless deposition, which is also called chemical reduction deposition or auto-catalytic deposition, technique of the present invention is utilized. In this technique, a reducing agent (Red), such as hypophosphite, boro hydride, hydrazine, dimethylamine-borane, formaldehyde or dialkylanine borane, is used to enhance the process cycle and reduce the deposition time period.

The reducing agent reacts, at the catalytic surface, with ions of the contact filling material 14, such as $Ni^{2+}$. Equation 2 shows the chemical reaction of this catalytic step.

$$Ni^{2+} + Red \xrightarrow{\text{Catalyst}} Ni^0 + Ox \qquad \text{(Equation 2)}$$

wherein the reducing species is supplied by the chemical reducing agent (Red) and Ox is generated as a product of the oxidation of the reducing agent; catalyst (catalytic surface) is described in detail in the general methods section after "agent" and before.

Figure 2:
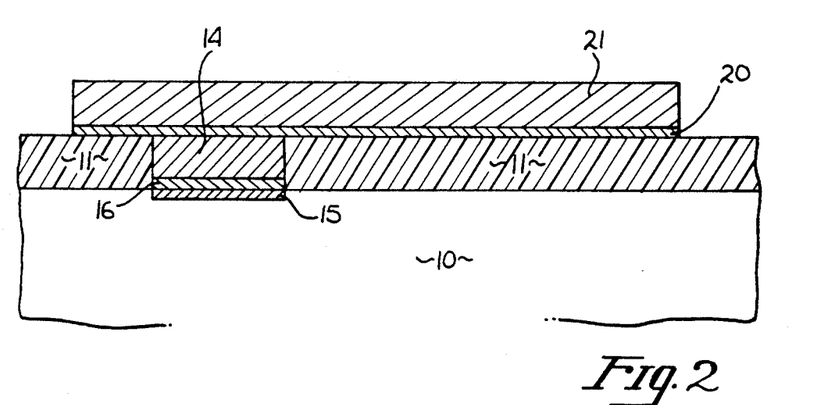
FIG. 2 is a cross-sectional view showing a formation of a first conducting layer.

Also referring to FIG. 2, in certain applications a specialized contact metal region is desirable to interconnect substrate 10 to deposition material 14 of window 12. In this instance, a contact metal region 15 is formed on substrate 10. The contact metal 15 provides a catalytic surface to the deposition material 14 than just silicon. The Contact metal 15 can be comprised of a silicide surface such as titanium silicide or tungsten silicide, or even a metal layer such as Al, Ti or W. If the contact metal 15 is not a catalytic surface for the depositing of contact filling material, then it can be activated by a thin layer of material that will provide the catalytic surface.

For example, if region 15 is comprised of Al, then selective deposition of Ni on the Al surface can not be achieved directly because Al is not catalytic to Ni deposition. However, Ni deposition on aluminum can be achieved by first activating the Al surface of region 15 by a thin layer of Pd. The Pd activation is achieved by utilizing a suitable chemical solution, such as $PdCl_2$ as shown by the following equation:

$$3Pd^{2+} + 2Al \rightarrow 3Pd + 2Al^{3+} \qquad \text{(Equation 3)}$$

The electroless metallization technique of the present invention selectively deposits a filling material by using a reducing agent. In those instances where the surface is not catalytic for the depositing of contact filling material, chemical activation solution, such as $PdCl^2$, is used to activate the surface of the non-catalytic material so that the contact filling material can be deposited onto the base material.

Several techniques are provided as examples at the end of the text of the Detailed Description, however, these examples are not to be interpreted to be limiting but are provided as several embodiments for the practice of the present invention.

In instances where migration of atoms between the silicon substrate 10 and upper layers are a concern, a barrier layer 16 is placed above contact region 15. Barrier layer 16 is formed by a deposition and lift-off process or it is formed by a blanket deposition technique including a heat cycle so that the deposited material can react with the substrate to form a silicide, such as titanium silicide, or react with gas ambient to form a nitride, such as titanium nitride.

Referring to FIG. 2, after filling window 12 with contact filling material 14, an adhesive layer 20 is formed above oxide layer 11 and contact filling material 14. Adhesive layer 20 is comprised of a conducting material. As used in the preferred embodiment, it is polysilicon, Al, Ti or chromium (Cr) having a very thin layer. Adhesive layer 20 is formed by chemical vapor deposition (CVD) process, evaporation process or sputtering process. Then, a conducting layer 21, which is typically termed the "first metal layer", is formed above adhesive layer 20. Earlier described processes are utilized to form conducting layer 21, the applicable process being determined by the underlying layer 20.

In the formation of conducting layer 21, a mask is placed over the underlying layers where no deposition is to occur. This masking step leaves bare portions of the adhesive layer 20 where selective deposition is to occur. Device 9 is then immersed in a wet solution, to activate the bare portions for electroless deposition. These steps are equivalent to that described for the selective deposition of filling material 14 in FIG. 1. In this instance, a conducting layer is formed over an underlying surface instead of using the same process for filling an opening, such as in FIG. 1. Conducting layer 21 of the present invention is formed from Cu, Au, Ni, Pd or Co and the activation of the adhesive layer 20 will depend on its composition, whether it is polysilicon, Al, Ti or Cr. Cladding techniques can also be used as described in Method 7 infra.

Figure 3:
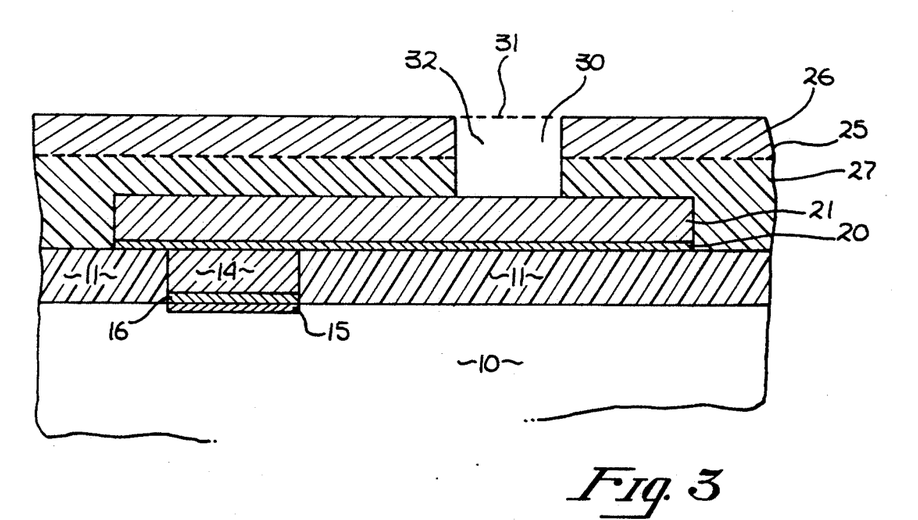
FIG. 3 is a cross-sectional view showing a formation of a dielectric layer over the first conducting layer and the filling of a via opening.

Referring to FIG. 3, a dielectric layer 25 is formed to insulate the underlying layers from the subsequent conducting layer which will be formed later. Dielectric layer 25 can be comprised of a variety of dielectric materials, such as glass, however, in the preferred embodiment, a two stage dielectric layer 25 is utilized. The dielectric layer 25 of the preferred embodiment has a lower region 27 comprised of silicon dioxide ($SiO_2$) and an upper region 26 comprised of silicon nitride ($Si_2N_4$) wherein the oxide and nitride regions 26 and 27 are deposited by a well-known CVD technique.

Then a via opening 30 is cut in dielectric layer 25 to expose a portion of conducting layer 21. The patterning of dielectric layer 25 to form via 30 is accomplished equivalently to the patterning of layer 11 for the opening of window 12. Via 30 is filled by filling material 32 substantially to the level of the upper surface of the dielectric layer 26 as shown by dotted lines 31. Again, one of the earlier described techniques is utilized to fill via 30 with depositing material 32 depending on the composition of the conducting layer 21. When the underlying conducting layer 21 is silicon or polysilicon, then the previously discussed techniques for depositing on a silicon substrate apply. However, when the underlying conducting layer 21 is a metal, such as Cu, Au, Ni, Pd, Co, Al, W, or Molybdenum (Mo), but not limited to these, then selective deposition of metal M on underlying surface S is achieved in one of the following general methods.

If S is catalytic for electroless deposition of M, direct electroless deposition of M on S can occur. In this instance, the process is represented by the overall reaction:

(Equation 4)

where $M^{z+}$ is a metallic ion of metal M, Red is a reducing agent, and Ox is an oxidation product of Red.

The oxidation-reduction reaction of Equation 4 proceeds only on a catalytic surface S. The anodic partial reaction is shown as:

(Equation 5)

Equation 5 shows the source of electrons ($e^-$) needed for the reduction of the metallic ions $M^{z+}$ in a cathodic partial reaction of Equation 6.

(Equation 6)

If surface S is not catalytic for electroless deposition of M, then activation of S is needed prior to depositing M. This activation is achieved by generating the catalytic metallic nuclei of metal M' on the surface S. The metal M' is catalytic for deposition of metal M. References (8) and (9) can be used to electrochemically or photochemically produce the catalytic metal nuclei.

Electroless deposition of M on M' activated surface S proceeds according to the general reaction (Equation 7)

Once catalytic nuclei M' are covered with depositing metal M, further electroless deposition of M proceeds according to equation 8.

(Equation 8)

The catalytic surface M can be generated in a displacement reaction shown in equation 9, wherein electroless deposition of M on S occurs after prior displacement reaction $S/M^{z+}$.

(Equation 9)

Where electrons ($e^-$) needed for reduction of metallic ions $M^{z+}$ of equation 6 are supplied by surface S in a partial anodic reaction of equation 10.

(Equation 10)

Once the surface S is covered with the depositing metal M from equation 9, further electroless deposition of M proceeds according to equation 8.

Figure 4:
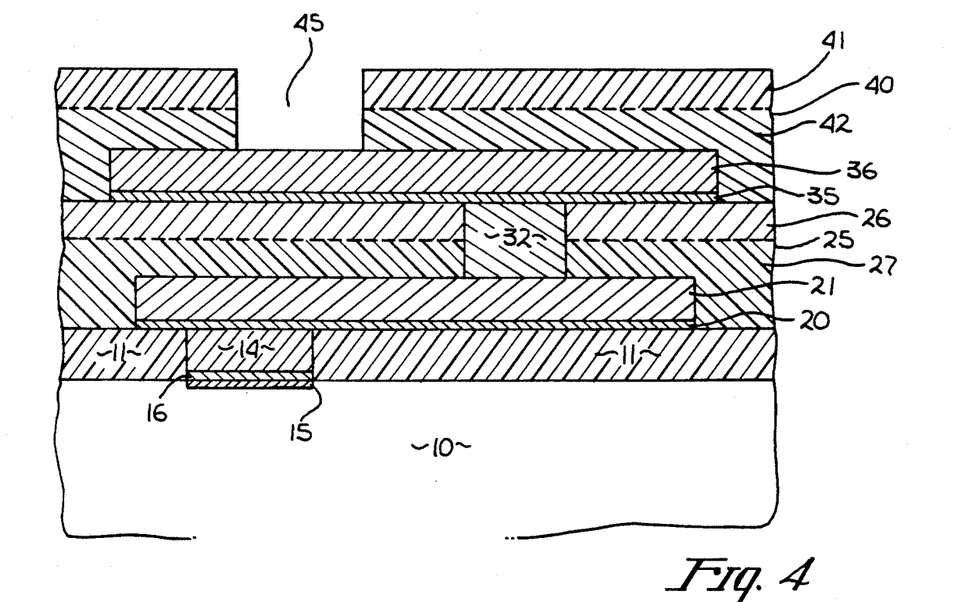
FIG. 4 is a cross-sectional view showing a formation of a second conducting layer and a subsequent dielectric layer.

The earlier described elements of Ni, Pd and Co, which were used to provide the contact filling material 14 are also available as via filling material 32. Further, because of the interconnection provided by via 30 which is isolated from the silicon substrate 10 by conducting layer 21, as well as oxide layer 11. Cu and Au are also available for electroless deposition of via 30. Then, a second adhesive layer 35 and second conducting layer 36 are formed above deposited material 32 and dielectric layer 25. Layers 35 and 36 are formed equivalently to the earlier described layers 20 and 21, respectively. Another dielectric layer 40 is deposited to isolate the second conductive layer 36. Again, as used in the preferred embodiment, dielectric layer 40 is comprised of an upper section 41 and a lower section 42, where $SiO_2$ is used for a lower section 42, and $Si_2N_4$ is used for upper section 41. However, the composition of the two sections 41 and 42 can be reversed also.

Figure 5:
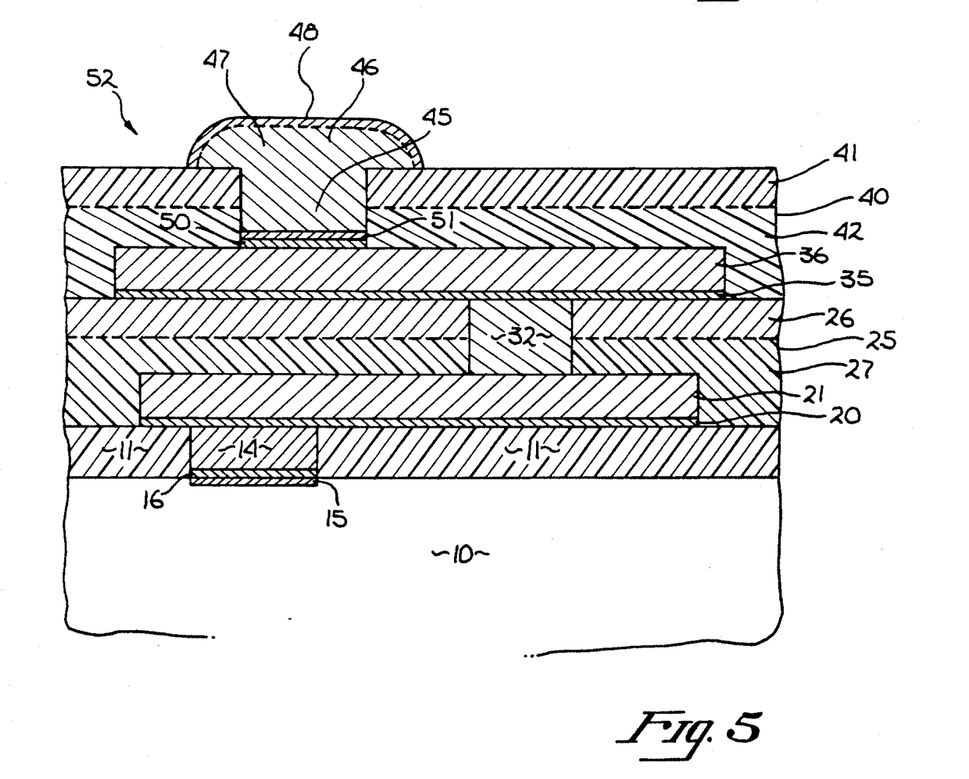
FIG. 5 is a cross-sectional view showing a formation of a solder/wire bond pad.

A window 45 is cut into dielectric layer 40 to expose a portion of second conducting layer 36. A pad 46 is then formed by selectively depositing Cu or Au, but not limited to these metals, as filling material 47 to fill opening 45, however, in this instance, to create the pad 46, the deposition of material 47 is continued beyond the surface of dielectric layer 40. A pad 46 having a bump-like extrusion is formed above opening 45. If pad 46 is formed from Cu, the outer surface 48 of pad 46 is electrolessly plated with Au or Pd to provide a more receptive surface for a wire bond terminal or a solder terminal.

In the preferred embodiment, a barrier layer to provide a barrier between conductive layer 36 and pad 46 is used. Although no barrier or a single barrier layer alone can be utilized, the preferred embodiment utilizes two layers 50 and 51. Adhesive layer 50 is comprised of either Cr or Ti, and barrier layer 51 is comprised of Cu or Ni. The deposition of layers 50 and 51 are achieved by either a sputtering process or by the electroless deposition process of the present invention.

A completed semiconductor device 52 utilizing the deposition techniques of the present invention is shown in FIG. 5, wherein device 52 includes a first conducting layer 21, a second conducting layer 36, contact interconnection 14 between the substrate 10 and the first conductive layer 21, via connection 32 between the two conductive layers 21 and 36, and the placement of a bonding pad 46 onto the second conductive layer 36. Although device 52 utilizes the selective deposition process of the present invention to form all five of these regions 14, 21, 32, 36 and 46, the technique of the present invention can be utilized to form any one or a combination of these regions. The exact process to be used will depend on the underlying layer and the selective depositing material chosen, wherein if the underlying layer is comprised of silicon or polysilicon, then the earlier described displacement deposition can be utilized. The displacement deposition can also be enhanced by adding a reducing agent to the deposition process. If the underlying layer is comprised of Al, then the electroless deposition technique, which first develops a catalytic surface as taught in the earlier description, is utilized to develop a catalytic surface on Al. If the underlying layer is another metal, then the processes described in conjunction with metal M on surface S are used for selective deposition. If only certain regions utilize the process of the present invention, then other regions can be formed by prior art deposition and etching techniques.

The following are examples of various methods which permit the practice of the present invention:

METHOD 1

A wafer having a silicon underlying layer and oxydized surface is sputtered with Al and patterned with photoresistive material prior to being cleaned by known prior art processes. Then adhesion is promoted on the Al by using an Al etchant containing $HNO_3$:HAc(glacial acetic acid):$H_3PO_4$:$H_2O$ in the weight ratio of 1:1:16:8 for 5 sec to 15 min at 20°-50° C. and then rinsed in deionized water. Then, electroless Ni is deposited selectively on the above prepared exposed Al surface in the following steps:

(i) the exposed Al surface of the patterned wafer is selectively activated with Pd by immersion in the solution containing 0.05 to 10 g/L $PdCl_2$ and 1 to 100 mL/L HCl, at 10° to 80° C., for 5 sec-30 min.

(ii) the wafer is rinsed with deionized water for 1-10 min. (iii) electroless Ni is deposited selectively on the Pd activated surfaces by immersion for 1-60 min at 20°-80° C. from the solution of the following composition,

| | |
|---|---|
| $NiSO_4.6H_2O$ | 1-100 g/L |
| Sodium citrate | 2-60 g/L |
| Lactic acid | 2-60 g/L |
| Dimethylamineborane (DMAB) | 0.5-10 g/L |
| Ammonium hydroxide to pH between 4 and 12 | |
| Temperature | 20-90° C. |

METHOD 2

A wafer having a silicon underlying layer and oxydized surface is sputtered with Al and patterned with photoresistive material and cleansed. Adhesion is promoted by $HNO_3$:HAc(glacial acetic acid):$H_3PO_4$:$H_2O$ in the weight ratio of 1:1:16:8 for 5 sec to 15 min at 20°-50° C. and then rinsed in deionized water.

Electroless Ni was deposited selectively on so prepared Al substrate in the following steps:

(i) the exposed Al surface of the patterned wafer is selectively activated with Pd by immersion in 5-50% of water solution, at 20°-60° C., of a commercial activator, NIKLAD$^{TM}$ 262, (catalyst for electroless nickel deposition) manufactured by Allied-Kelite Division of Witco Chemical Corporation, for 5 sec-30 min.

(ii) same as step (ii) in Method 1.
(iii) same as step (iii) in Method 1.

METHOD 3

A wafer having an underlying silicon layer and oxydized surface is sputtered with Al and patterned with silicon dioxide ($SiO_2$) is cleaned. Adhesion is then promoted by the adhesion promoting step of Method 1.

Electroless Ni is deposited selectively on so prepared exposed Al surface in the following steps:

(i) exposed Al surface of the patterned wafer is selectively activated with Pd by immersion in the solution at 20°-60° C., containing 0.05-10.0 g/L of $PdCl_2$, 1-50 mL (37%) HCl, 1-50 mL water, 200-1000 mL glacial acetic acid and 1-25 mL (49%) HF.

(ii) same as step (ii) in Method 1.
(iii) same as step (iii) in Method 1.

METHOD 4

A wafer having a silicon underlying layer and oxydized surface is sputtered with Al and patterned with photoresistive material and cleansed. Adhesion is promoted as in Method 1.

Electroless Ni is deposited selectively on so prepared exposed surface in the following three steps:

(i) same as step (i) in Method 2.
(ii) same as step (ii) in Method 2.
(iii) electroless Ni was deposited selectively only on the Pd activated Al surfaces by immersion for 5-60 min. in the modified commercial electroless Ni solution NIPOSIT$^{TM}$ 468 (nickel and dimethylamine boron), manufactured by the Shipley Company Inc., at 30°-80° C. and at pH adjusted with ammonium hydroxide in the pH range from 5 to 10 (pH measured at 22° C.).

METHOD 5

A wafer having a silicon underlying layer and oxydized surface is sputtered with Al and patterned with photoresistive mask and cleansed. Adhesion is promoted as in Method 2.

(i) same as step (i) in Method 2.
(ii) same as step (ii) in Method 2.
(iii) Ni is deposited by immersion for 5-60 min. in the modified commercial electroless Ni solution, NIKLAD$^{TM}$ 752, manufactured by Allied-Kelite Division of Witco Chemical Co., at 30°-85° C. and at pH in the range of 5-11. The solution pH is adjusted with ammonium hydroxide, at 22° C.

METHOD 6

A wafer having a silicon substrate, silicon dioxide ($SiO_2$) passivating layer and silicon nitride ($Si_3N_4$) layer (approximately 0.1 um thick) is patterned with another layer of $SiO_2$ to define interconnection lines, and then Al or Ti is sputtered approximately 0.1-0.2 um thick on $Si_3N_4$ exposed in these interconnection lines. Interconnection lines are formed on such an integrated circuit wafer by electroless deposition of Cu on the exposed Al surfaces. The process steps involved in generating interconnection lines are as follows.

(i) Etching of Al for 1 min by immersion in the solution, at 20°–60° C. containing $HNO_3$:HAc (glacial acetic acid):$H_3PO_4$:$H_2O$ in the weight ratio of 1:1:16:8.

(ii) Rinsing with deionized water at 22° C., for 1–10 min.

(iii) Electroless deposition of Cu for 5–60 min at 20°–90° C. from the solution of the following composition

| | |
|---|---|
| $CuSO_4.5H_2O$ | 1–30 g/L |
| $Na_2EDTA$ (ethylenedinitrilo)-tetracetic acid disodium salt | 5–80 g/L |
| NaCN | 1–100 mg/L |
| $CH_2O$ (formaldehyde, 38% solution) | 1–25 mL/L |
| NaOH to give a pH between 8 and 13 (measured at 22° C.) | |

METHOD 7

A wafer having a silicon substrate and covered with $SiO_2$ has Al interconnection lines (approximately 1 um thick) formed on the $SiO_2$ by methods of the prior art. Methods of this invention are used for copper cladding of aluminum lines on $SiO_2$ substrate. Copper (approximate thickness 0.25 um) is selectively electrolessly deposited on Al interconnection lines only; no copper deposit is formed on $SiO_2$.

The process steps involved in copper cladding of aluminum interconnection lines on $SiO_2$ substrate are as follows.

(i) Etching of Al for 5 sec to 10 min by immersion in the solution, at 20°–60° C. containing $HNO_3$:-HAc:$H_3PO_4$:$H_2O$ in the weight ratio of 1:1:16:8.

(ii) Rinsing with deionized water at 22° C., for 1–10 min.

(iii) Electroless deposition of copper for 5–25 min at 20°–90° C. from the solution of the composition of Method 6(iii).

METHOD 8

A wafer having a silicon substrate with Al and $SiO_2$ layers and patterned with via hole outlines in $SiO_2$ is cleaned and adhesion is promoted as in Method 1. Palladium (Pd) is deposited selectively only on the exposed Al surface of the patterned sample by immersion for 30 sec–15 min in the solution at temperature from the interval from −5° C. to 80° C., of the following composition

| | |
|---|---|
| $PdCl_2$ | 0.5–25 g/L |
| Hydrochloric acid (HCl) | 0–10 mL/L |
| $NH_4OH$ (27%) (ammonium hydroxide) | 50–300 mL/L |
| $NH_4Cl$ (ammonium chloride) | 5–40 g/L |
| $NaH_2PO_2.H_2O$ (sodium hypophosphite) | 0–30 g/L |
| Ammonium hydroxide to pH between 6 and 12. | |

METHOD 9

A wafer having a silicon substrate with Al and $SiO_2$ layers and patterned with via hole outlines in $SiO_2$ is cleaned and adhesion is promoted as in Method 1.

Palladium (Pd) is deposited selectively on the exposed Al surface of the patterned sample by immersion for 30 sec–15 min in the solution at temperature from the interval from −5° C. to 80° C., of the following composition

| | |
|---|---|
| $PdCl_2$ | .5–25 g/L |
| HCl | 0–10 mL/L |
| $NH_4OH$ (27%) | 50–500 mL/L |
| $Na_2EDTA$ (ethylenedinitrilo-tetraacetic acid disodium salt) | 5–60 g/L |
| hydrazine hydrate $H_2NNH_2.H_2O$ | 0–5 g/L |
| Ammonium hydroxide to pH between 4 and 12 | |

METHOD 10

A wafer having a silicon substrate with Al and $SiO_2$ layers and patterned with via outlines in $SiO_2$ is cleaned in an ultrasonic cleaner with water or water with a surfactant as a cleaning solution and adhesion is promoted as in Method 1.

Electroless copper is deposited selectively on so prepared Al in the following three steps:

(i) The exposed Al surface of the patterned sample is selectively activated with Pd by immersion either in the solution of Method 8 or in the solution of Method 9 at −5° C. to 80° C., for 2 sec–5 min.

(ii) The sample is rinsed with deionized water for 1–10 min.

(iii) Electroless Cu is deposited selectively on the Pd activated surfaces by immersion for 1–60 min at 20°–80° C. in the solution of Method 6(iii).

METHOD 11

A wafer having a silicon substrate is sputtered with Al and patterned with $SiO_2$ is cleaned, adhesion is promoted, activated with Pd, and rinsed as in Method 10.

Electroless Ni is deposited selectively on the Pd activated surfaces by immersion for 1–60 min at 20°–80° C. in the solution of Method 1, 2 or 5.

METHOD 12

A wafer having a silicon substrate is covered with $SiO_2$, patterned to define interconnection lines and contact holes (holes above sigments of devices), and then titanium silicide ($TiSi_2$) is formed on silicon surfaces exposed (not covered with $SiO_2$) in interconnection lines, and contact holes by methods of prior art. Alternatively, tungsten silicide ($WSi_x$) can be formed instead of $TiSi_2$ ($TiSi_x$). Methods of this invention are used to selectively deposit Ni on titanium silicide (or tungsten silicide) in interconnection lines and contact holes. The process steps involved in Ni deposition are as follows.

(i) Silicide in interconnection lines and contact holes is cleaned in 50:1 ($H_2O$:HF) for 1 sec–3 min.

(ii) The sample is rinsed with deionized water for 1–10 min.

(iii) The exposed silicide of the patterned sample is selectively activated with Pd by immersion into 5–50% water solution, at 20°–60° C., of a commercial activator NIKLAD™ 262 (catalyst for nickel deposition), for 5 sec-30 min.

(iv) The sample is rinsed with deionized water for 1-10 min.

(v) Electroless Ni is deposited selectively on the Pd activated surfaces by immersion for 1-60 min at 20°-80° C. from the modified commercial solution NIKLAD™ 752 (nickel-boron system, maximum 1% boron), at pH in the range from 5 to 11. The solution pH is adjusted with ammonium hydroxide, at 22° C.

METHOD 13

A wafer having a silicon substrate is covered with $SiO_2$ and then patterned to define interconnection lines and contact holes. Methods of this invention are used to selectively deposit Ni on silicon in interconnection lines and contact holes. The process steps involved in Ni deposition are as follows.

(i) Silicon in interconnection lines and contact holes is cleaned and adhesion promoted in $HNO_3:HF:H_2O$ in the volume ratio of 25:2:25 for 10 sec to 15 min at 20°-50° C.

(ii) The sample is rinsed with deionized water for 1-10 min.

(iii) Electroless Ni is deposited selectively on the exposed silicon surfaces of the patterned sample by immersion for 1-60 min at 20°14 75° C. from the modified commercial solution NIPOSIT™ 468 (catalyst for nickel deposition), at pH in the range from 6 to 10.

The above examples are for examples of practicing the present invention and are not meant to limit the present invention to these specific methods.

Thus, an electroless deposition process for IC fabrication is described.

We claim:

1. In the fabrication of integrated circuits, a process for selectively depositing a conductive material on a semiconductor substrate, wherein said semiconductor substrate is selected from the group consisting of silicon and any Class III-V semiconductor, comprising the steps of:
   depositing a dielectric layer on said substrate;
   forming a contact opening in said dielectric layer to expose said substrate;
   activating said exposed substrate for electroless deposition;
   selectively depositing a contact filling material onto said activated exposed substrate in said contact opening by electroless deposition until a predetermined level is reached such that a substantially planarized surface is formed by said dielectric layer and said contact filling material filled in said contact opening;
   depositing a conducting layer over said contact filing material such that said contact filing material provides an interconnection between said substrate and said conducting layer.

2. The process of claim 1 wherein said contact filling material is selected from the group consisting of nickel, palladium and cobalt.

3. The process of claim 1 wherein said electroless deposition is performed in a solution containing a reducing agent selected from the group consisting of hypophosphite, borohydride, dimethylamine-borane, formaldehyde, dialkylamine borane, and hydrazine.

4. The process of claim 1 wherein said layer comprises an oxide.

5. The process of claim 1 wherein said activating step comprises etching said substrate in a mixture comprising HF, $HNO_3$ and $H_2O$.

6. The process of claim 3 wherein said activating step comprises etching said substrate in a mixture comprising HF, $HNO_3$ and $H_2O$.

7. The process of claim 1 further including the step of depositing a contact metal on said substrate after forming said contact opening in said dielectric layer and exposing said substrate.

8. The process of claim 7 wherein said contact metal is selected from the group consisting of aluminum, titanium, and tungsten.

9. The process of claim 7 wherein said contact metal forms a silicide surface with said substrate.

10. The process of claim 1 further including the step of depositing a barrier metal on said contact metal prior to said electroless deposition.

11. The process of claim 10 wherein said barrier metal is selected from the group consisting of titanium and tungsten.

12. The process of claim 10 wherein said barrier metal reacts with said substrate to form a silicide.

13. The process of claim 10 wherein said barrier metal reacts with a gas ambient to form a nitride.

14. The process of claim 1 further including the step of depositing an adhesion layer prior to depositing said conducting layer.

15. In the fabrication of integrated circuits, a process for providing selective electroless deposition of a conducting material on an underlying surface, comprising the steps of:
   forming a contact layer on said underlying surface;
   masking said contact layer to expose portions of said contact layer;
   activating the surface of said exposed portions of said contact layer by using an activation agent to form an electrochemically activated contact layer surface when the surface of said contact layer is electrochemically inactive;
   depositing selectively by electroless deposition said conducting material on said electrochemically activated contact layer surface, wherein said conducting material is only deposited on said electrochemically activated contact layer surface, wherein said conducting material deposited on said contact layer forms an interconnection line on said underlying surface.

16. The process of claim 15, further comprising the step of promoting adhesion on said exposed portions of said contact layer by using an etchant prior to activating said contact layer.

17. The process of claim 16, wherein said etchant is a mixture comprising $HNO_3$, HAc, $H_3PO_4$, and $H_2O$.

18. The process of claim 15, wherein said conducting material is selected form the group consisting of nickel, palladium, cobalt, gold, and copper.

19. The process of claim 15 wherein said electroless deposition is performed in a solution comprising a reducing agent.

20. The process of claim 19, wherein said reducing agent is selected from the group consisting of hypophosphite, borohydride, dimethylamine-borane, formaldehyde, dialkylamine borane, and hydrazine.

21. The process of claim 17, wherein said electroless deposition is performed in a solution comprising a reducing agent selected from the group consisting of hypophosphite, borohydride, dimethylamine-borane, formaldehyde, dialkylamine borane, and hydrazine.

22. The process of claim 15, wherein said contact layer is an adhesive layer selected from a group consisting of polysilicon, aluminum, titanium, and chromium.

23. The process of claim 15 wherein said activating agent is a solution comprising palladium ions.

24. The process of claim 17 wherein said activating agent is a solution comprising palladium ions.

25. The process of claim 21 wherein said activating agent is a solution comprising palladium ions.

26. The process of claim 22 wherein said activating agent is a solution comprising palladium ions.

27. The process of claim 16, wherein
   (A) said contact layer is formed by sputting aluminum;
   (B) said adhesion is promoted by using an aluminum etchant;
   (C) said activating the surface of said contact layer is achieved by said activation agent wherein said activating agent is a solution comprising palladium ions and HCI;
   (D) said electroless deposition selectively deposits nickel on said palladium activated surface.

28. The process of claim 15 wherein said interconnection line is electrically coupled to a contact filing in a contact opening in said underlying layer.

29. The process of claim 20 wherein said interconnection line is electrically coupled to a contact filling in a contact opening in said underlying layer.

30. In a fabrication of integrated circuits, a process for providing selective electroless deposition of a conducting material on an interconnection line, comprising the steps of:
   forming said interconnection line on a dielectric layer, wherein said dielectric layer includes an opening filled with a conductive material, wherein said interconnection line is electrically coupled to said conductive material;
   etching said interconnection line with an etchant;
   cladding said conducting material on said interconnection line by selective electroless deposition wherein said conducting material is only deposited on said interconnection line.

31. The process of claim 30, wherein said interconnection line comprises aluminum.

32. The process of claim 31, wherein said etchant is a mixture comprising $HNO_3$, $HAc$, $H_3PO_4$, and $H_2O$.

33. The process of claim 30, wherein said conducting material is copper.

34. In the fabrication of integrated circuits, a process for selectively depositing a conductive material on an underlying surface, comprising the steps of:
   depositing a dielectric layer on said underlying surface;
   forming an opening in said dielectric layer to expose said underlying surface;
   selectively activating said exposed underlying surface to be an electrochemically active surface for electroless deposition when said exposed underlying surface is electrochemically inactive;
   depositing a conductive material onto said electrochemically active surface in said opening by electroless deposition until a predetermined level is reached.

35. The process of claim 34, further comprising the step of depositing a conducting layer over said conductive material such that said conductive material provides an interconnection between said underlying surface an said conducting layer.

36. The process of claim 35, further comprising the step of depositing an adhesion layer prior to depositing said conducting layer.

37. The process of claim 36, wherein said underlying surface is conductive, wherein said underlying surface comprises a material selected form the group consisting of aluminum, tungsten, molybdenum, nickel, palladium, cobalt, gold, and copper.

38. The process of claim 37, wherein said conducting layer comprises a material selected from the group consisting of aluminum, tungsten, molybdenum, nickel, palladium, cobalt, gold, and copper.

39. The process of claim 37 wherein said conducting layer is selectively deposited by electroless deposition and comprises a material selected from the group consisting of nickel, palladium, cobalt, gold, and copper.

40. The process of claim 34, wherein the said electroless deposition is performed in a solution comprising a reducing agent.

41. The process of claim 40, wherein said reducing agent is selected from the group consisting of hypophosphite, borohydride, dimethylamine-borane, formaldehyde, dialkylamine borane, and hydrazine.

42. The process of claim 34, wherein said conductive material comprises a material selected from the group consisting of nickel, palladium, cobalt, gold, and copper.

43. The process of claim 34, further comprising the step of promoting adhesion on said exposed underlying surface by using an etchant prior to said activating step.

44. The process of claim 34 wherein said predetermined level of said conductive material in said opening extends beyond the surface of said dielectric layer, and wherein said conductive material is used as a bonding pad.

45. The process of claim 42 wherein said predetermined level of said conductive material in said opening extends beyond the surface of said dielectric layer, sand wherein said conductive material is used as a bonding pad.

46. The process of claim 34, wherein said underlying surface is a conductive layer which is electrically coupled to said conductive material in said opening, wherein said conductive material functions as a bonding pad.

47. The process of claim 34, further including the step of depositing a adhesion layer in said opening prior to said activating step.

48. The process of claim 46, further including the step of depositing a barrier metal on said adhesion layer prior to said activating step.

49. The process of claim 46, wherein said adhesion layer comprises a material selected from the group consisting of chromium and titanium.

50. The process of claim 47, wherein said barrier metal is selected from the group consisting of copper and nickel.

* * * * *

UNITED STATES PATENT AND TRADEMARK OFFICE
CERTIFICATE OF CORRECTION

PATENT NO. : 5,169,680
DATED : December 8, 1992
INVENTOR(S) : Chiu H. Ting, et al It is certified that error appears in the above-indentified patent and that said Letters Patent is hereby corrected as shown below:

Column 16, line 13, delete "form" insert --from--.

Signed and Sealed this

Eleventh Day of July, 1995

Attest:

BRUCE LEHMAN

Attesting Officer

Commissioner of Patents and Trademarks